United States Patent [19]

Diedrich

[11] Patent Number: 4,977,748

[45] Date of Patent: Dec. 18, 1990

[54] VACUUM CONTAINER FOR CRYOGENICALLY COOLED ELECTRON DEVICE PACKAGING

[76] Inventor: Heinz K. Diedrich, Via Scalpelli, 1, I-00019 Tivoli, (Rome), Italy

[21] Appl. No.: 444,891

[22] Filed: Dec. 1, 1989

[30] Foreign Application Priority Data

Dec. 5, 1988 [EP] European Pat. Off. ........ 88120335.0

[51] Int. Cl.$^5$ ............................................ F25B 19/00
[52] U.S. Cl. ..................................... 62/51.1; 62/259.2; 250/352
[58] Field of Search ............................ 62/51.1, 259.2; 250/352

[56] References Cited

U.S. PATENT DOCUMENTS

| | | | |
|---|---|---|---|
| 4,059,764 | 11/1977 | Belasco et al. | 250/352 |
| 4,118,947 | 10/1978 | Diedrich et al. | 62/51.1 |
| 4,206,354 | 6/1980 | Small, Jr. | 250/352 |
| 4,340,405 | 7/1982 | Steyert, Jr. et al. | 62/51.1 |
| 4,451,735 | 5/1984 | Diedrich et al. | 250/352 |
| 4,712,388 | 12/1987 | Sullivan et al. | 62/51.1 |
| 4,739,633 | 4/1988 | Faris | 62/51.1 |
| 4,805,420 | 2/1989 | Porter et al. | 62/51.1 |

*Primary Examiner*—Ronald C. Capossela
*Attorney, Agent, or Firm*—Herbert Dubno

[57] ABSTRACT

A vacuum package for electron devices operating at cryogenic temperatures provides a silicon-metal multilayer heatpath with lowest thermal impedance between electron device and cryogen, has a solid body for heat transfer to the external heat sink and a silicon carrier board as mounting cold station for electron device assemblies with high multifunction and integration complexity. For heat transfer component is joined to the package wall by a silicon-glass seal. The multilayer heatpath construction uses standard silicon technology and materials which are compatible with requirements for high vacuum integrity performance. A modular package construction flow chart results in high design flexibility, low cost and mass production capability.

11 Claims, 2 Drawing Sheets

VACUUM CONTAINER FOR CRYOGENICALLY COOLED ELECTRON DEVICE PACKAGING

The present invention relates to a package for solid state electron devices which operate at temperatures in the cryogenic range of 10 to 150 K.

Numerous classes of cryogenically cooled electron devices are known, and they suit a vast range of very different functional requirements.

The field of application of cooled electron devices is traditionally in low-noise detection of weak electromagnetic signals like parametric amplifiers for microwave telecommunication links, linear arrays of infrared detectors for thermal imagery and superconductive quantum interference devices (SQID's) for detection of spurious magnetic fields in medical diagnosis. More advanced versions, as for instance infrared area arrays with integrated electronic scanning architectures, are available or being developed.

More recently, and well known to people skilled in the art of solid state science and technology, entirely new device classes have emerged which benefit from some particular electronic properties at low temperatures and which capitalize on advances in material growth and in semiconductor energy band gap and lattice structure engineering. For example: cryogenically cooled, ultra-fast digital and analogical IC's, employing high electron mobility transistor (HEMT) or heterojunction bipolar transistor (HBT) structures, prove to be of extreme interest to the military/aerospace, computer and communications business worldwide.

It is known that all the aforementioned more advanced devices feature high multifunction and integration complexity. Monolithic and hybrid assembly technologies are applied on circuit boards with large numbers of input/output pads which need cold stations with uniform temperatures over large areas. Proper thermal biasing over the temperature range of practical interest must be provided according to optimum operational performance requirements of the specific electron device. Performance of some devices is very sensitive to temperature variations and this requires exact and controlled temperature biasing.

BACKGROUND OF THE INVENTION

This invention provides a multi-purpose package technology which suits the requirements of cryogenically cooled electron devices over the entire 10 to 150 K range, aiming at meeting standards of operational performance and lifetime reliability comparable to those set for devices operating at room temperature and suitable for mass production.

Low temperature operation requires the electron device component be encapsulated in an evacuated container. Such a vacuum encapsulation is commonly designated as DEWAR. The package of the invention is of the dewar type, and the innovation concerns the cryogenic interface between the cooler and its thermal payload, the encapsulated electron device.

The cryogenic interface is constituted of a coldfinger member onto which the electron device is mounted in the inner evacuated portion of the encapsulation. The non-evacuated portion of the coldfinger is mechanically connected to a cryocooler. The cold tip of the cooler is in thermal contact with a small area of the wall of the coldfinger close to the device, thereby causing heat from the device in the interior to flow through a multi-layer heatpath comprising the wall of the coldfinger, into the exterior cryogenic heat sink.

It is well known to those skilled in the design and manufacture of cryogenically cooled electron devices that the multi-layer heatpath involves a particularly complex problem, namely, how to get the cold into the active electronic component most effectively, while at the same time ensuring a vacuum life performance appropriate to modern package standards.

Many different Dewar versions have been proposed prior to the invention.

An illustrative example is a dewar for multielement infrared detectors (see U.S. Pat. No. 4,206,357). Useful as it is for the specific applications in thermal imaging, it however was severe limitations regarding its use for other applications: the cryogenic interface provides borosilicate glass as coldfinger wall material. Glasses have high thermal resistivities, and the temperature drop across the glass layer limits the use of the dewar to devices with low heat payload and limited physical dimensions, or to those in which temperature non-uniformity or floating are acceptable.

Another similar dewar, see U.S. Pat. No. 4,059,764, provides Kovar as coldfinger wall material which is a much better heat conductor than glass.

However, in both references, the heatpath of the cryogenic interface comprises at least one layer of an organic resin such as epoxy between the coldfinger wall and the electron device. Expoxies are very poor heat conductors with thermal resistivities about ten times higher than even that of glass. The use of Kovar is therefore an improvement compared with the first version but it is not a solution for the problem of constructing a multi-purpose dewar package which suits thermal requirements of the entire class of the aforementioned advanced electron devices.

It is also known that epoxies are long-term degassing sources and are inconsistent with the requirements for reliable, hard vacuum devices: Unpredictable virtual leak rates and total amount of released gas due to minute variations in resin composition from lot to lot make this kind of material class highly detrimental for dewar mass production.

SUMMARY OF THE INVENTION

The invention circumvents the shortcomings of the use of epoxies or other thermo-mechanically matching resins and eliminates thereby an inherent technological weakness in previous dewar designs:

It is well known to people skilled in the art of the above mentioned electron devices that their materials have particularly small expansion coefficients at lower temperatures and that in many III-V and II-VI compound semiconductors and in their alloys thermal expansion converges toward zero with expansion coefficient inversion in the 100 to 50 K range. These very peculiar, but common properties make them suitable to for instance, epitaxially grown heterostructures with the aforementioned applications in cooled devices but, on the other hand, cause dilatation mismatch failures to the previously used materials such as glass or Kovar without intermediate strain absorption resin layers, bearing in mind that the multi-layer heatpath structure must withstand thermal cycling of at least 150 degrees.

This invention provides a technological solution to the dilemma of the concurrence of contradictory mechanical, thermal and chemical aspects. It references the heretofore used heatpath materials with single crystal silicon.

The innovative element of the invention is the technological integration of silicon with borosilicate glass which offers all the known advantages of mature and reliable vacuum tube technology, benefitting from silicon as a material with very high thermal conductivity at low temperatures and as a close match to the active electronic component, in particular to those of its own diamond-zincblende device family, to which most of the aforementioned device materials belong.

The package of the invention is distinguished by the following:

silicon is the coldfinger heat transfer element with lowest thermal resistance between the cryogenerator and electronic component;

the silicon heat transfer element, across a UHV-tight silicon-glass seal, is an integrated part of the vacuum encapsulation;

the silicon-glass seal withstands thermal shocks by quenching from 473 to 77 degrees K; it allows outgassing or soldering processes at temperatures up to 500° C.;

the silicon is a matched and virtually isothermal mounting base for the electronic component, a motherboard for complex and large area devices in higher level joining assemblies and is substrate for monolithic and/or hybrid auxiliary circuitry;

the absence of mismatch-compensating layers of resins in the cryogenic heatpath results in vacuum life expectancy corresponding to electron tube specification standards;

the glasses used in the coldfinger silicon-glass seal are compatible with standard metal-to-glass and metal package construction technologies; and the modular design structure allows fabrication flowchart breakdown in autonomous, parallel production lines for each of the assembly modules.

BRIEF DESCRIPTION OF THE DRAWING

The above and other objects, features and advantages of my invention will become more readily apparent from the following description, reference being made to the accompanying highly diagrammatic drawing in which.

SPECIFIC DESCRIPTION

As apparently the best known material in solid state device technology, silicon characteristic data is commonly available. Numerical values quoted in the following are taken from M. G. Holland, L. J. Neuringer, Report Internat. Conf. Physics of Semiconductors, Exeter, the Inst. of Physics and the Phys. Soc., 1962, pp. 474-481.

Figure 1:
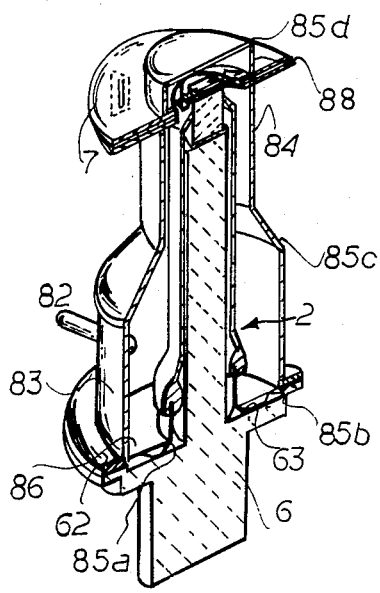
FIG. 1 is a scale drawing of a practical package in modular version in section.
Figure 4:
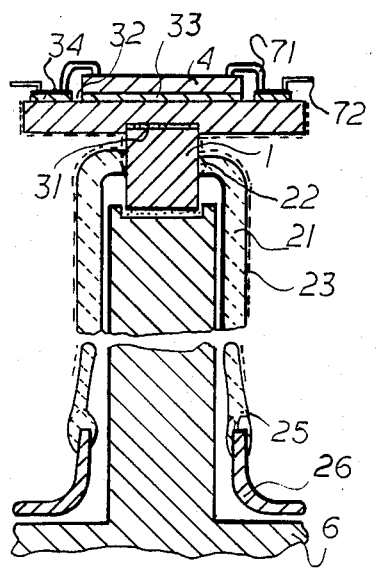
FIG. 4 shows the details of the innovative cryogenic interface between electron device and coldfinger.
Figure 2:
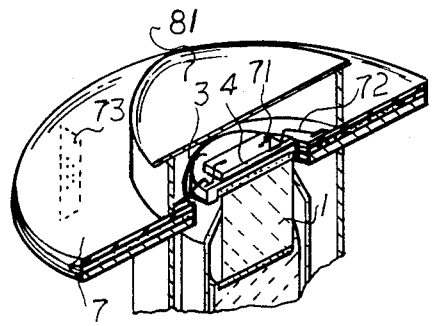
FIG. 2 is a sectional perspective view of interconnections.
Figure 3:
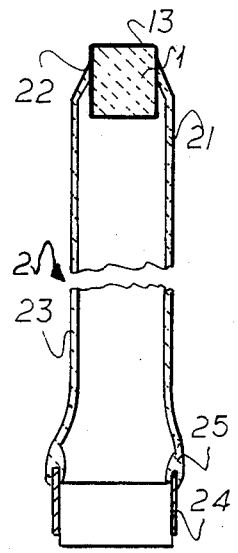
FIG. 3 is a cross section of the coldfinger module, referring to FIG. 1.

The following description of the package refers to FIGS. 1, 2, 3 and to FIG. 4, which show the innovative part of the invention in all details.

The package of FIG. 1, is built up from four assembly modules which are separately constructed, checked and qualified. The tubular cold finger module 2, FIG. 3, constitutes the central part around which the package is assembled coaxially. Its upper closed end comprises a cylindrical, rod-shaped heat transfer member 1 which is concentrically and hermetically sealed into a tubular glass member 21 of the coldfinger module. At the lower end of the coldfinger module the glass tube 21 is sealed to a metal tube 24.

The heat transfer member 1 is high-purity, single crystal silicon which is an extremely good thermal conductor at low temperatures. It provides the heat path from the electron device 3 across the silicon cold station 4, both situated in the evacuated portion of the package encasement, to the opposite outer surface thereof.

The metal tube 24 is joined to a cup-shaped metallic evacuation module, consisting of a bottom plate 86 and a tubular member 83 which comprises a radially extending evacuation tube 82 and three electrical feedthroughs for two incorporated re-activable getters. Feedthroughs and getters are not shown in the figures. Feedthroughs and evacuation tube 82 are hermetically assembled with the tubular member 83 by means of well known brazing techniques and the components 24, 86 and 83 by laser welding at the rims 85a and 85b.

The upper part of the outer encasement is the feedthrough module. It consists of the metallic tubular members 84 and 88. They are joined to the ring-shaped electrical feedthrough component 7 by means of a brazing process.

The feedthrough component carries a plurality, in the illustrative example of FIG. 1 a number of 36, of inward to outward radially extending electrical leads for input-/output signals, grounds, biasing and other auxiliary circuitry connections of the electron device 4.

The feedthrough ring 7 is a laminated and sintered metal/ceramic multi-layer stack. The multi-layer configuration, its construction procedure and its application in a vacuum tight dewar for infrared detectors are fully described in U.S. Pat. No. 4,451,735. The electrical leads terminate in four groups of metallized throughholes, 73, compatible with pin centers of standard miniature connector plugs. Feedthrough module and evacuation module are joined by laser welding at rim 85c.

The fourth module of the package is a metal cover 81 which is welded to the feedthrough module at rim 85d after electron device mounting on the coldfinger and after the inner wiring of interconnections to the feedthrough leads, before the evacuation process. For electron devices with optical inputs it accommodates a window with interferential and metal layers for spectral and spatial filtering.

Each of the four assembly modules is a self-contained unit and is assignated to a specific technical function of the package. This modular approach enables package manufacture to be divided into parallel, autonomous production lines for each module with the advantages of having transparent process flow chart breakdown and organisation and of allowing early failure identification and rejection on sub-assembly construction level.

The coldfinger construction refers to FIGS. 3, 4 and 7. Starting material for the heat transfer element 1 is an as-cut, (111) oriented, single crystal silicon slice of standard production diameter. Slice thickness is 8 mm. Cylindrical rods of 7 mm diameter are shaped ultrasonically.

Heat propagation in silicon is carried by the phonon-field and lattice imperfections of any kind cause phono-scattering which reduces thermal conductivity. High-quality, high-purity silicon is therefore favourable but the quantitative specification depends on thermal requirements of the specific electron device. For most purposes the following characteristics are satisfactory: low dislocation density, "etch pit free" quality; majority impurity concentration of about $1 \times 10^{14}$ cm$^{-3}$ or less; boron-doped P-type or phosphorus-doped N-type silicon.

These materials are standard for silicon device mass production.

Table I shows indicative values of thermal conductivity lambda in watts per cm degree and thermal resistance R in degrees per watt of the 8 mm/7 mm rod for various temperatures.

TABLE I

| degrees K | 10 | 20 | 30 | 50 | 70 | 100 | 150 |
|---|---|---|---|---|---|---|---|
| Lambda | 20 | 45 | 45 | 27 | 16 | 8 | 2,6 |
| R | 0.1 | 0.04 | 0.04 | 0.08 | 0.13 | 0.26 | 0.8 |

Figure 7A:
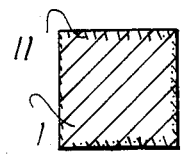
FIGS. 7A-7D shown in sectional views successive stages in the silicon-glass seal construction process.
Figure 7C:
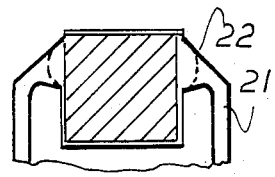

FIGS. 7A–7D illustrate the glass-silicon sealing process. The mechanically damaged surface layer 11, FIG. 7A, is chemically removed by a standard etch solution as for instance: HF-HNO$_3$-CH$_3$COOH, 1:2:1 or HF-HNO$_3$, 1:1 plus some drops of H$_2$SO$_4$. Complete removal is important to avoid vacuum leakage in the glass seal along microcracks and thermal conductance deterioration caused by the formation of dislocation lines or slip planes generated at the damaged surface and extending into the inner of the rod during the high-temperature glass sealing process.

Figure 7B:
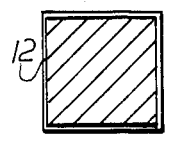

The next step is the growth of a 0.3 micron silicon oxide layer, FIG. 7B, 12, by standard thermal oxidation.

The sealing process is performed in accordance with the art of glass-to-metal seal construction and no special facilities and tools are needed. The seal is made on a glass working lathe. For axial alignment the rod 1 is positioned on a quartz vacuum chuck. Wall thickness of tube 21 is 0.5 mm. The glass of seal 22 is canary glass, Corning code 3320 or Pyrex, Corning code 7740. The glass type of tube 24 depends on the tube 24 material. For Kovar (Vacon), it is made of Kovar glass, Corning code 7052, with canary glass as the seal 22 material.

For Fe Ni Cr steels like st.st. 304, the combination: seal 22/tube 21/seal 25 is entirely Pyrex where provisions have to be made for proper shape of the tube 24 according to Housekeeper's rules for non-matched glass-to-metal seals.

Technical characteristics of the glasses are of common knowledge. Obviously, other equivalent glass types can be used such as the Schott glass Duran 8330 instead of Pyrex. It is also obvious to choose other sealing combinations like silicon/Pyrex for seal 22 and tube 21/two layer graded seal 25/Kovar.

The oxide layer 12 at the joint of 22 is completely dissolved in the liquid glass. The exposed silicon oxide in the inner of tube 21 is etched off in a standard chemical solution and the coldfinger configuration is completed by sealing the lower tube 24 to tube 21.

The annealing schedule is: Cooling rate of 1 degree per minute from a temperature slightly above the annealing point (An. P.) to the strain point (St. P.) of the seal 22 glass. Holding time is 15 hours at St. P. Cooling time is 1 degree per minute down to St. P. of the softer, seal 25 glass. Example for the combination canary (a) and Kovar (b) glasses: An. P. (a) is 540, St. P. (a) is 493, St. P. (b) is 436 degrees C.

A pickling process on tube 24 is followed by a 100 percent thermal shock out-process test. Procedure: dip upper part of coldfinger including rod 1, seal 22 and part of tube 21 into liquid nitrogen. Repeat 10 times. Perform helium leak test before and afterwards. Condition: leak rate less than $10^{-11}$ std. He.

An additional shock test is performed on rod 1/seal 22/tube 21 samples: heat up samples to 473K, quench by dropping them into liquid nitrogen (77K).

Samples must be crack-free and leak-tight.

The remarkable high stability of the silicon-glass seals against most severe thermal stresses has been empirically found on test samples with up to four inches diameters. Thermal contraction figures of silicon and the used glasses predict the glass-to-silicon joint a quite well matched seal down to ambient temperatures and a compression seal at low temperatures. Metal-glass compression seals are known as thermally very strong joints.

The calculated high tangential tensile stress in the glass seal suggests the ring width of the seal 22 to be kept small and anyway, not larger than the empirically corroborated value of about 2.5 mm for a 0.5 mm thick tube wall.

Concerning the high adhesion strength at the glass-silicon interface, it is believed that the borosilicate glass liquid substitutes the native silicon oxide layer at the fresh silicon surface by forming essentially the same strong oxygen-silicon bonds.

The coldfinger is outgassed at 350° C. for 2 hours in dry air. Further to surface cleaning, this process also aims at out-diffusing the vacuum contaminant helium which is penetrated into the glass bulk during preceding leak tests.

Figure 7D:
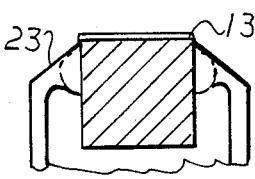

The degassed glass and the silicon rod surfaces which will be exposed to vacuum in the package are then sealed off by a sputter deposited layer 23, FIG. 7D, of 0.6 microns nichrome and 0.10 microns gold.

Virtual leak sources are thereby practically eliminated and at the same time, the non-oxidized metal layer, thanks to its minimum absorption coefficient, reduces thermal losses via radiation absorption to only a very small fraction of its value for a glass surface. Nichrome has high thermal resistivity which keeps parallel conduction heat loss along the coldfinger tube wall low. Gold protects the nichrome against oxidation during the subsequent package and electron device assembly steps.

On-sputtered gold, 0.5 microns, is added on top of rod 1. This layer 13 is the solder contact area for cold station assembly.

Figure 5:
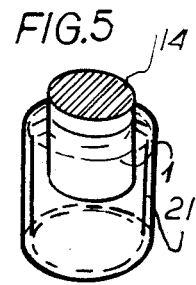
FIGS. 5 and 6 are sectional perspective views showing different heat transfer configurations.
Figure 6:
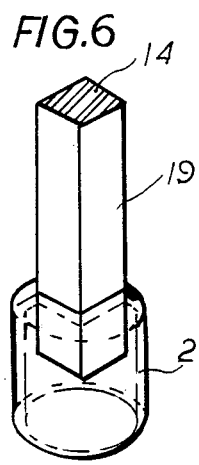

Feasible are various physical forms of the heat transfer element. The FIG. 6 shows an execution of the silicon-glass configuration with a squared bar 19 instead of the cylindrical rod 1 heat transfer body of FIG. 5. For length/diameter ratios much greater than one, mechanical shaping by drilling is difficult and expensive and the heat transfer element is therefore cut from the silicon slice. It is essential to round the edges chemically before glass sealing by etching at least 50 microns off the plane side surfaces.

High-purity single crystal silicon is highly transparent in the thermal infrared so reflection coating against radiation absorption is not critical. Metallization is performed by electroless plating techniques.

The electron device/cold station assembly is mounted on area 14 which is distant from the cooler 6 of FIG. 1. This is advantageous where close vicinity of for instance EMI sources or ferromagnetic materials penalize operational performance.

For a heat transfer element of 40 mm length and same cross-section as before, thermal resistance is still below 0.5 per watt at 50 degrees K.

Coldfinger, evacuation and feedthrough modules of the package are assembled according to the previous package description.

The cold station 3, FIGS. 2 and 4, substrate for the electron device chip 4, is constructed from single crystal silicon and as such it is not only a mechanical carrier but it is also an integral part of the assembled electron device. The double function as thermal conductor and as a base suited to accommodate integrated hybrid or monolithic passive and active planar components, makes the use of silicon particularly advantageous.

The following construction procedure is an illustrative example of the simplest structure without integrated electronic components. No details will be given to construction elements, obvious in the art of technological silicon processing and emphasis will be placed on the thermal aspect only.

The cold station 3 in FIG. 2 is a 2 mm thick disk of 10 mm diameter. Silicon material characteristics are usually the same as for the heat transfer element. Its front surface is polished and thermally oxidized, 32. Its back face provides an alignment seat for heat transfer element mounting. The entire surface is sputter metallized with titanium-palladium-gold, 35, and a pattern of conductor lines 34 and solder pad 33 is photolithographically and chemically delineated on the front face.

For cold stations with integrated components like in-diffused conductor lines, PN-junctions, MOS structures or others, higher P or N type bulk impurity levels are often preferable. Highly doped silicon exhibits higher thermal resistance but its use is not prohibitive if proper choice for the specific device requirements is made. For example, estimated thermal resistances for an impurity concentration of $4 \times 10^{16}$ per $cm^3$ and for the physical dimensions of 3 in FIG. 2, are less than 0.05 degrees per watt in the range from 20 to 100 degrees K where most of the cryogenically cooled electron devices operate and at 10 and 150K it is 0.2 and 0.1 degrees per watt, respectively.

Provided thermal compatibility, cold station design flexibility is therefore practically only limited by constraints in the current art of silicon device fabrication and by economical trade-off considerations.

The metallized device chip 4 is soft soldered on the pad 33 and its electrical terminals are gold bonded, 71, to the conduction lines 34. In FIG. 2 only two terminals on chip 4 are shown. The assembly 3 and 4 is electrically checked and then soft soldered, 31, on the heat transfer element 1 of the coldfinger module 2. Alloys for minimum fatigue joints are commercially available and joining techniques are of common knowledge. Thermal resistance of a metal layer joint is of the order of 0.1 degrees per watt and per square cm for 100 microns thickness for more typical solders. Layer thicknesses must therefore be kept small.

The interconnection wires 72 bridge electrically and thermally the gap between cold station 3 and feedthrough component 7. The connectors 72 are 60/40 copper-nickel, 12 microns thick and 60 microns wide rolled wires with high mechanical strength and flexibility.

They are bonded to the inner, 34, and outer conductor lines by parallel-gap or stitch welding. Conductive thermal loss is 0.5 mwatt per wire and electrical resistance is 2.5 ohm for a length of 5 mm.

Much lower electrical resistances are obviously feasible but inherently at the expense of proportionally higher thermal conductive losses.

A flange 62 is mounted around the encasement member 83. The body 6 is the expander of a 0.5 watt split cycle Sterling cooler. It is clamped to flange 62 and is vacuum tightened by O-ring seal 63. A stack of flexible copper wire mesh spacer 61 provides the thermal contact between cooler 6 and heat transfer element 1.

In another version, the mesh spacers are of Nylon thread. During the cool down phase, the cooler works at zero load with maximum speed. When reaching the boiling point of the surrounding gas, the heat exchange is carried by the turbulent convection of the precipitating, liquified gas in the Nylon mesh. This version is particularly advantageous for electron devices with thermal bias ranging between boiling point at normal pressure to triple point of gasses like nitrogen, oxygen, argon or neon. The space between coldfinger 2 and cooler 6 is filled with the appropriate gas.

The package design of the invention can be shaped to many particular electron devices keeping in mind that heat conduction in silicon at 70 degrees K is four times that of copper at room temperature and is even much higher at lower temperatures (see Table 1).

In general, design must take into account that for a silicon component with very small linear dimensions, thermal conduction is reduced by phononscattering at the surfaces.

The silicon heat transfer element of the invention is most suited to rapid cool down and to efficient temperature control. Both thermal resistance and thermal capacity in silicon drop drastically with decreasing temperature to very small values in the cryogenic range, enabling a most economical cooler operation. When steady state temperature conditions are reached, the very small thermal impedance of the load allows tight thermal feedback control. Cooler power is switched down to below-nominal regime which leads to reduced input power dissipation, to low microphonics interference levels in the electron device and less mechanical wear which improves cooler life expectancy.

The striking dynamic thermal characteristics make silicon an advantageous heat transfer material also in applications where rapid cool down is a premium requisite.

Figure 8:
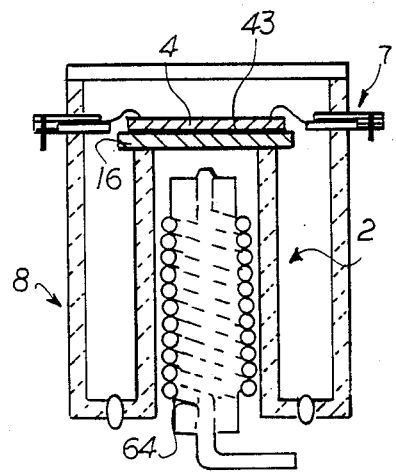
FIGS. 8 and 9A-9C show a sectional view of a package version suited to open-cycle Joule Thompson coolers in the construction of this latter package.

FIG. 8 shows schematically a package suited to fast device cooling, consisting of the coldfinger 2 which is closed by a sealed silicon disk 16 and an outer encasement with integrated feedthrough component 7. The coldfinger glass tube has an inner precision bore of 5.18 mm which fits a standard Joule Thompson minicooler 64. The electron device 4 is assembled to the silicon disk 16 with a solder preform 43.

Figure 9A:
Figure 9B:
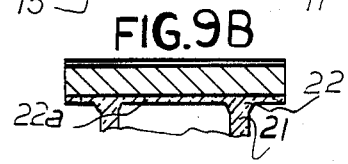
Figure 9C:

FIGS. 9A-9C explain the construction procedure of the silicon-glass seal for an illustrative numerical example. Most processes refer to those described by FIGS. 7A-7D. Starting material is a (111) oriented, 0.3 mm thick silicon wafer. Both sides are polished and thermally oxidized, 15. Disk 16 is ultrasonically drilled and damaged layer 17 is chemically removed. The disk is T-sealed, 22, to a Pyrex tube 21 with 0.5 mm wall thickness. Alternatively, canary glass for seal 22 and Kovar glass for tube 21 are used.

During sealing process, a thin glass layer 22a is often formed. A layer of for instance 5 microns thickness has a prohibitively high thermal resistance of about 0.2 degrees per watt and the layer 22a is therefore etched off with diluted (e.g. 15%) hydrofluoric acid.

Annealing and reflection metallization of the coldfinger are the same as for the FIGS. 7A–7D version.

Thermal shock resistance of the T-seal is high and the same test criteria are applied as given in the construction procedure related to FIGS. 1, 2, 3, and 4. Layer 18 is a sputter deposited titanium-palladium-gold contact for solder preform 43.

Cool down time of disk 16 is no more determined by the thermal resistance-capacity product which would result in times less than 10 msec but by the thermal inertia of the cooler itself and by the mechanism of heat exchange with the liquified gas.

By comparison, a commercially available V-shaped, high-speed minicooler employs approximately 2.5 seconds to reach the liquid point of argon at 87 degrees K and this proves the usefulness of package FIG. 10 with the T-shaped silicon-glass seal coldfinger.

The herein described invention and the disclosed construction procedures have been exemplified with reference to several illustrative vacuum container versions but people skilled in the art will recognize that modifications to the examples may be made without departing from the spirit and scope of the invention. For example:

It is obvious that the electrical feedthrough component 7 of FIGS. 1, 2 and 10 may be constructed in metal-glass sealing technique and that the innovative heat transfer element in silicon-glass sealing technology may be applied to other dewar concepts as for instance to those quoted in Ref (1) and (2).

It is also obvious that the cryogen may be of a different type for example, a liquified gas with a heat exchange mechanism known as bulk cooling.

It also turns out from the disclosed invention that it may be extended to a variety of devices or components which are not of the solid state but which have to be efficiently cooled and which require a hermetically sealed encapsulation as for example the active medium in gass-lasers.

Another application of the invention is for instance in devices which require efficient cooling of large surface areas as for example in cryopumps.

The aforementioned 4-inch silicon-glass transfer element proposes for construction of dewar devices with particularly high heat power throughput which is evidence of the usefulness of the invention also for efficient high power heat exchangers.

REFERENCES CITED (1) W. H. Small Jr., U.S. Pat. No. 4,206,354
(2) M. Belasco et al., U.S. Pat. No. 4,059,764
(3) M. G. Holland, L. J. Neuringer, Report Internat. Conf. Physics of Semiconductors, Exeter, the Inst. of Physics and the Phys. Soc., 1962, pp. 474–481
(4) H. K. Diedrich et al., U.S. Pat. No. 4,451,735.

What is claimed:

1. A vacuum container comprising:
   (a) an external encasement constituting a part of the boundary of the evacuated portion of the container and consisting of a generally cylindrical peripheral wall member and a cover member joining said peripheral wall member in squared relationship;
   (b) a center coldfinger module constituting another part of the boundary of the evacuated portion of the container and consisting of a tubular member, a solid body member and a tube member with said tubular member projecting axially into said peripheral wall member and having an open end which forms part of a hermetic seal to said tube member which joins said peripheral wall member in radially extending and generally coaxial relationship and with said solid body member being concentrically sealed into the other end of said tubular member and having two exposed faces in perpendicular relationship to the axis of said tubular member with the one face projected into the evacuated portion of the container and the other face situated in the non-evacuated portion within said tubular member; and
   (c) a carrier board member having two parallel faces one of which being disposed on said solid body member within the evacuated portion of the container in sealing relationship; the vacuum container being characterised by the fact that:
   (d) said solid body member consists of silicon,
   (e) said carrier board member consists of silicon,
   (f) said tubular member consists of a silicate glass,
   (g) said solid body member to tubular member seal, and is a silicon-glass seal
   (h) said carrier board member and solid body member disposition is a silicon-metal-silicon joint.

2. A vacuum container as defined by claim 1 wherein said silicon materials of said solid body member and said carrier board member are single crystal (111) oriented, etch pit free silicon.

3. The vacuum container as defined by claim 2 wherein said silicon of said solid body member has an impurity concentration of $10^{14}$ cm$^{-3}$ or less and said silicon if said carrier board member has an impurity concentration of $10^{17}$ cm$^{-3}$ or less.

4. A vacuum container as defined by claim 1 wherein said solid body member is a silicon rod with circular or rectangular cross-section with the one face which is projected from said silicon-glass seal into the evacuated portion of the container being thermally oxidised and the other face being projected from said silicon-glass seal into the inner of said tubular member.

5. A vacuum container as defined by claim 1 wherein said solid body member is a thin circular or rectangular silicon chip and that said face situated in the evacuated portion of the container is thermally oxidized and the opposite face is joined to said tubular member by means of said silicon-glass seal in butted relationship.

6. A vacuum container as defined by claim 1 wherein the glass of said silicon-glass seal is CORNING glass 7740 or CORNING glass 3320.

7. A vacuum container as defined by claim 6 wherein said CORNING glass 7740 is sealed to said tubular member consisting of CORNING glass 7740 and that said CORNING glass 3320 is sealed to said tubular member consisting of CORNING glass 7052.

8. A vacuum container as defined by claim 1 wherein the surfaces of said tubular member, said thermally oxidised silicon solid member and said silicon-glass seal adjacent to the vacuum in the container are metallized by a sputter-deposited nichrome-gold or titanium-palladium-gold layer.

9. A vacuum container as defined by claim 1 wherein said carrier board member is a thermally oxidized and metallized (35) disc with a diameter to thickness ratio of 10 to 1 or less.

10. A vacuum container as defined by claim 1 wherein said tube member is a metal tube consisting of KOVAR (R) or stainless steel 304.

11. A vacuum container as defined by claim 4 wherein on said face of said solid body which is projected from said silicon-glass seal into the inner of said tubular member a stack of mesh spacers is disposed in mechanical relationship to the adjacent tip of a cryogenic engine with said mesh spacers consisting of copper or gold wire or of Nylon thread.

* * * * *